(12) United States Patent
Katrak

(10) Patent No.: US 10,734,690 B2
(45) Date of Patent: Aug. 4, 2020

(54) SELF-DIAGNOSING BATTERY CELL MONITORING SYSTEM

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 263 days.

(21) Appl. No.: 16/046,965

(22) Filed: Jul. 26, 2018

(65) Prior Publication Data
US 2019/0033386 A1    Jan. 31, 2019

Related U.S. Application Data

(60) Provisional application No. 62/538,851, filed on Jul. 31, 2017.

(51) Int. Cl.
| | | |
|---|---|---|
| *H01M 10/48* | (2006.01) | |
| *H02H 1/00* | (2006.01) | |
| *H02H 7/18* | (2006.01) | |
| *H03K 5/24* | (2006.01) | |
| *G01R 35/00* | (2006.01) | |
| *H01M 10/42* | (2006.01) | |
| *G01R 31/3835* | (2019.01) | |

(Continued)

(52) U.S. Cl.
CPC ........ *H01M 10/48* (2013.01); *G01R 31/3835* (2019.01); *G01R 35/00* (2013.01); *H01M 10/425* (2013.01); *H02H 1/0007* (2013.01); *H02H 7/18* (2013.01); *H03K 5/24* (2013.01); *G01R 31/396* (2019.01); *H01M 2/34* (2013.01); *H01M 10/482* (2013.01); *H01M 2010/4271* (2013.01)

(58) Field of Classification Search
CPC .... H01M 2220/20; H01M 2/206; H01M 2/34; H01M 2/348; H01M 2/202; H01M 2/1077; H01M 10/482; H01M 10/425; H01M 10/48; G01R 35/00; G01R 31/3835; G01R 31/396; H02H 1/0007; H02H 7/18; H03K 5/24
See application file for complete search history.

(56) References Cited

U.S. PATENT DOCUMENTS

2014/0377594 A1* 12/2014 Suzuki ................... H01M 2/34
429/7

OTHER PUBLICATIONS

U.S. Appl. No. 16/013,130, filed Jun. 20, 2018 entitled Battery Cell Management System That Detects Data Misalignment Between Battery Cell Voltage Values and Battery Cell Overvoltage Flags.

(Continued)

*Primary Examiner* — Bryan R Perez
(74) *Attorney, Agent, or Firm* — Buckert Patent & Trademark Law Firm PC; John F. Buckert

(57) ABSTRACT

A self-diagnosing battery cell monitoring system having a battery cell voltage monitoring IC with a digital voltage substrate, an analog differential voltage substrate, and an analog voltage substrate is provided. The first diagnostic handler application commands a digital input-output device to generate control signals to transition a contactor to an open operational state if the first diagnostic flag associated with the digital voltage substrate is equal to the first encoded fault value, or the second diagnostic flag associated with the analog differential voltage substrate is equal to the second encoded fault value, or the third diagnostic flag associated with the analog voltage substrate is equal to the third encoded fault value.

14 Claims, 10 Drawing Sheets

(51) Int. Cl.
  *G01R 31/396*  (2019.01)
  *H01M 2/34*  (2006.01)

(56) References Cited

OTHER PUBLICATIONS

U.S. Appl. No. 16/028,092, filed Jul. 5, 2018 entitled Battery Cell Management System.
U.S. Appl. No. 16/031,333, filed Jul. 10, 2018 entitled Battery Management System That Detects Communication Faults.
U.S. Appl. No. 16/032,293, filed Jul. 11, 2018 entitled Battery Management System.

* cited by examiner

| DIGITAL VOLTAGE SUBSTRATE | ENCODED FAULT VALUE (HEXADECIMAL) FOR FIRST APPLICATION | ENCODED NON-FAULT VALUE (HEXADECIMAL) FOR FIRST APPLICATION |
|---|---|---|
| FIRST DIAGNOSTIC FLAG | 21 | 12 |

FIG. 7

| ANALOG DIFFERENTIAL VOLTAGE SUBSTRATE | ENCODED FAULT VALUE (HEXADECIMAL) FOR SECOND APPLICATION | ENCODED NON-FAULT VALUE (HEXADECIMAL) FOR SECOND APPLICATION |
|---|---|---|
| SECOND DIAGNOSTIC FLAG | 48 | 84 |

FIG. 8

| ANALOG VOLTAGE SUBSTRATE | ENCODED FAULT VALUE (HEXADECIMAL) FOR THIRD APPLICATION | ENCODED NON-FAULT VALUE (HEXADECIMAL) FOR THIRD APPLICATION |
|---|---|---|
| THIRD DIAGNOSTIC FLAG | B7 | 7B |

FIG. 9

| DIGITAL VOLTAGE SUBSTRATE | ENCODED FAULT VALUE (HEXADECIMAL) FOR FOURTH APPLICATION | ENCODED NON-FAULT VALUE (HEXADECIMAL) FOR FOURTH APPLICATION |
|---|---|---|
| FOURTH DIAGNOSTIC FLAG | 84 | 48 |

FIG. 10

| ANALOG DIFFERENTIAL VOLTAGE SUBSTRATE | ENCODED FAULT VALUE (HEXADECIMAL) FOR FIFTH APPLICATION | ENCODED NON-FAULT VALUE (HEXADECIMAL) FOR FIFTH APPLICATION |
|---|---|---|
| FIFTH DIAGNOSTIC FLAG | 7B | B7 |

| ANALOG VOLTAGE SUBSTRATE | ENCODED FAULT VALUE (HEXADECIMAL) FOR SIXTH APPLICATION | ENCODED NON-FAULT VALUE (HEXADECIMAL) FOR SIXTH APPLICATION |
|---|---|---|
| SIXTH DIAGNOSTIC FLAG | 12 | 21 |

SELF-DIAGNOSING BATTERY CELL MONITORING SYSTEM

CROSS-REFERENCE TO RELATED APPLICATION

This application claims priority to U.S. Provisional Patent Application No. 62/538,851 filed on Jul. 31, 2017, the entire contents of which are hereby incorporated by reference herein.

BACKGROUND

The inventor herein has recognized a need for an improved self-diagnosing battery cell monitoring system that can detect fault conditions in a battery cell voltage monitoring IC. The self-diagnosing battery cell monitoring system utilizes diagnostic flags associated with a digital voltage substrate, an analog differential voltage substrate, an analog voltage substrate in the battery cell voltage monitoring IC with encoded fault values or encoded non-fault values having Hamming distances of four from one another to obtain freedom from interference in detecting fault conditions.

SUMMARY

A self-diagnosing battery cell monitoring system in accordance with an exemplary embodiment is provided. The system includes a battery cell voltage monitoring IC having a digital voltage substrate, an analog differential voltage substrate, and an analog voltage substrate therein having trenched electrical isolation therebetween. The system further includes a microcontroller having a first memory buffer, first, second, and third applications, and a first diagnostic handler application. The first memory buffer has first, second, and third diagnostic bits associated with the digital voltage substrate, the analog differential voltage substrate, and the analog voltage substrate, respectively. The first application sets a first diagnostic flag to a first encoded fault value if the first diagnostic bit in the first memory buffer is equal to a first bit value indicating a fault condition in the digital voltage substrate. The second application sets a second diagnostic flag to a second encoded fault value if the second diagnostic bit in the first memory buffer is equal to the the first bit value indicating a fault condition in the analog differential voltage substrate. The third application sets a third diagnostic flag to a third encoded fault value if the third diagnostic bit in the first memory buffer is equal to the first bit value indicating a fault condition in the analog voltage substrate. The first diagnostic handler application commands a digital input-output device to generate control signals to transition a contactor to an open operational state if the first diagnostic flag is equal to the first encoded fault value, or the second diagnostic flag is equal to the second encoded fault value, or the third diagnostic flag is equal to the third encoded fault value.

BRIEF DESCRIPTION OF THE DRAWINGS

FIG. 7 is a table having a fault value and a non-fault value for a first diagnostic flag associated with a digital voltage substrate in a battery cell voltage monitoring IC;

FIG. 8 is a table having a fault value and a non-fault value for a second diagnostic flag associated with an analog differential voltage substrate in the battery cell voltage monitoring IC;

FIG. 9 is a table having a fault value and a non-fault value for a third diagnostic flag associated with an analog voltage substrate in the battery cell voltage monitoring IC;

FIG. 10 is a table having a fault value and a non-fault value for a fourth diagnostic flag associated with a digital voltage substrate in the battery cell voltage monitoring IC;

DETAILED DESCRIPTION

Figure 1:
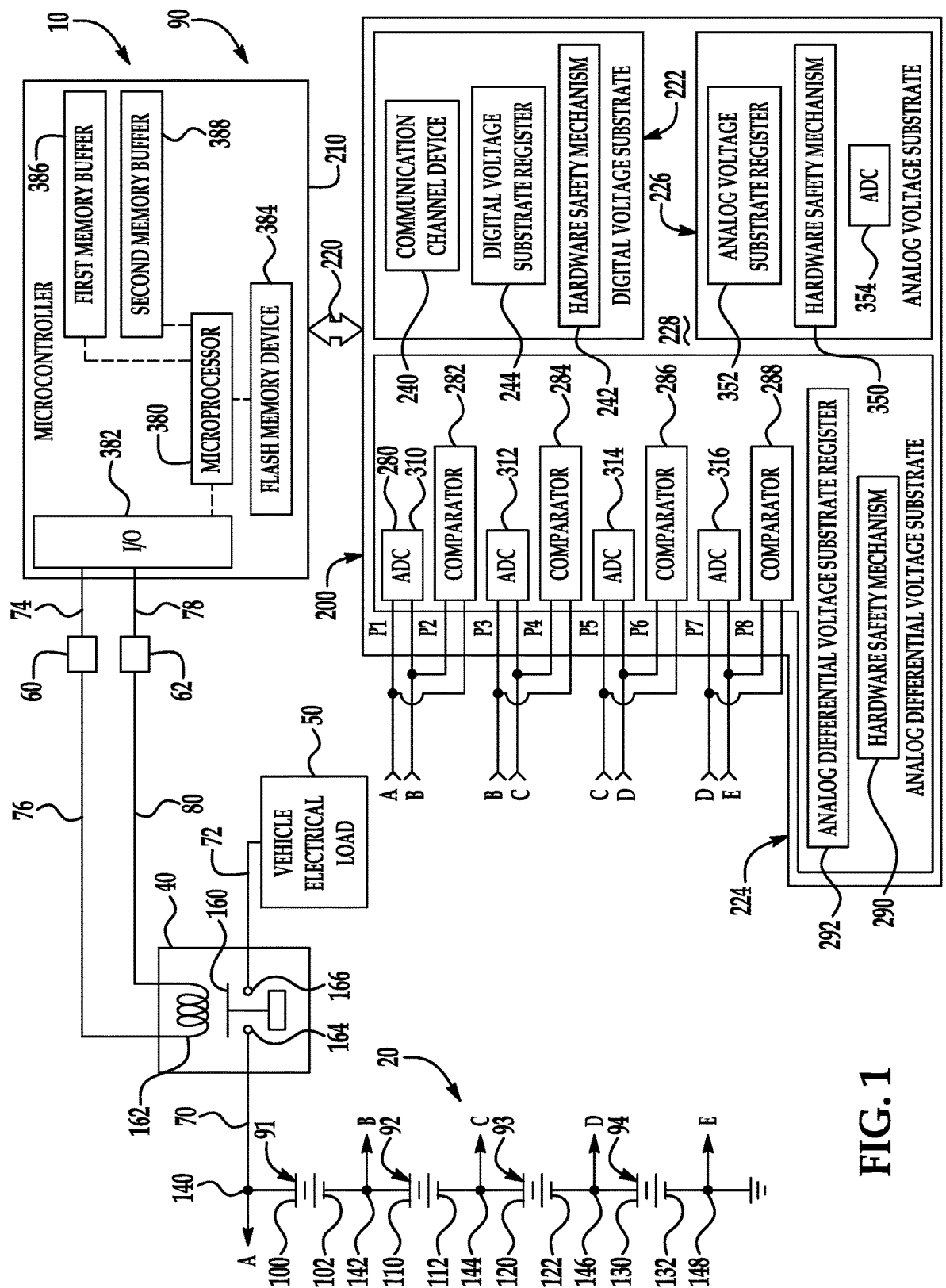
FIG. 1 is a schematic of a vehicle having a battery pack and a self-diagnosing battery cell monitoring system in accordance with an exemplary embodiment.

Referring to FIG. 1, a vehicle 10 is provided. The vehicle 10 includes a battery pack 20, a contactor 40, a vehicle electrical load 50, voltage drivers 60, 62, electrical lines 70, 72, 74, 76, 78, 80, and a self-diagnosing battery cell monitoring system 90.

An advantage of the self-diagnosing battery cell monitoring system 90 is that the system 90 can detect fault conditions in a battery cell voltage monitoring IC 200 and utilizes diagnostic flags associated with a digital voltage substrate 222, an analog differential voltage substrate 224, an analog voltage substrate 226 in the battery cell voltage monitoring IC having encoded fault values or encoded non-fault values with Hamming distances of four from one another to obtain freedom from interference with the diagnostic flags.

For purposes of understanding, a few terms utilized herein will be described.

The term "node" or "electrical node" refers to a region or a location in an electrical circuit.

The term "IC" refers to an integrated circuit.

The term "detecting a fault condition in a . . . voltage substrate" means detecting a fault condition in any electrical component on or in the voltage substrate.

The battery pack 20 includes first, second, third, fourth battery cells 91, 92, 93, 94 that are electrically coupled in series to one another. The first battery cell 91 includes a positive terminal 100 and a negative terminal 102, and the second battery cell 92 includes a positive terminal 110 and a negative terminal 112. Further, the third battery cell 93 includes a positive terminal 120 and a negative terminal 122, and the fourth battery cell 94 includes a positive terminal 130 and a negative terminal 132. The negative terminal 100 is electrically coupled to the positive terminal 110, and the negative terminal 112 is electrically coupled to the positive terminal 120. Further, the negative terminal 122 is electrically coupled to the positive terminal 130, and the negative terminal 132 is electrically coupled to electrical ground.

An electrical node 140 is electrically coupled to the positive terminal 100 of the first battery cell 91, and is further electrically coupled to the analog-to-digital converter 280, in the battery cell voltage monitoring IC 200. Also, an electrical node 142 is electrically coupled to the positive terminal 110 of the second battery cell 92, and is further electrically coupled to the battery cell voltage monitoring IC 200. Further, an electrical node 144 is electrically coupled to the positive terminal 120 of the third battery cell 93, and is further electrically coupled to the battery cell voltage monitoring IC 200. Also, an electrical node 146 is electrically coupled to the positive terminal 130 of the fourth battery cell 94, and is further electrically coupled to the battery cell voltage monitoring IC 200. Further, an electrical node 148 is electrically coupled to electrical ground, and is further electrically coupled to the battery cell voltage monitoring IC 200.

The contactor 40 has a contact 160, a contactor coil 162, a first electrical node 164, and a second electrical node 166. The first electrical node 164 is electrically coupled to the positive terminal 100 of the first battery cell 91 via the electrical line 70. The second electrical node 166 is electrically coupled to the vehicle electrical load 50 via the electrical line 72. A first end of the contactor coil 162 is electrically coupled to the voltage driver 60 via the electrical line 76. The voltage driver 60 is further electrical coupled to the digital input-output device 382 of the microcontroller 210 via the electrical line 74. A second end of the contactor coil 162 is electrically coupled to the voltage driver 62 via the electrical line 80. The voltage driver 62 is further electrically coupled to the digital input-output device 382 of the microcontroller 210 via the electrical line 78.

When the microcontroller 210 generates first and second control signals that are received by the voltage drivers 60, 62, respectively, the contactor coil 162 is energized which transitions the contact 160 to a closed operational state, which results in the vehicle electrical load 50 receiving a voltage from the battery pack 20. Alternately, when the microcontroller 210 generates third and fourth control signals that are received by the voltage drivers 60, 62, respectively, the contactor coil 162 is de-energized which transitions the contact 160 to an open operational state. In an exemplary embodiment, the third and fourth control signals can each be a ground voltage level.

The self-diagnosing battery cell monitoring system 90 is provided to determine battery cell voltage values associated with the first, second, third, fourth battery cells 91, 92, 93, 94, and to determine when fault conditions occur within the battery cell voltage monitoring IC 200. The self-diagnosing battery cell monitoring system 90 includes the battery cell voltage monitoring IC 200, a microcontroller 210, and a communication bus 220.

The battery cell voltage monitoring IC 200 is provided to measure battery cell voltages of the first, second, third, fourth battery cells 91, 92, 93, 94 and to generate associated battery cell voltage values. The battery cell voltage monitoring IC 200 is further provided to detect fault conditions in a digital voltage substrate 222, an analog differential voltage substrate 224, and an analog voltage substrate 226 therein.

The battery cell voltage monitoring IC 200 includes the digital voltage substrate 222, an analog differential voltage substrate 224, and an analog voltage substrate 226, and an entrenched electrical isolation region 228 therein. The entrenched electrical isolation region 228 extends between the substrates 222, 224, 226 and electrically isolates the substrates 222, 224, 226 from one another.

Figure 2:
FIG. 2 is a simplified schematic of a digital voltage substrate register having a binary diagnostic bit therein that is utilized in a battery cell voltage monitoring IC in the system of FIG. 1.

Referring to FIGS. 1 and 2, the digital voltage substrate 222 includes a communication channel device 240, a hardware safety mechanism 242, and a digital voltage substrate register 244 therein. The communication channel device 240 is utilized to allow the battery cell voltage monitoring IC 200 to communicate with the microcontroller 210 via the communication bus 220. The hardware safety mechanism 242 is utilized to detect a fault condition within the digital voltage substrate 222. When the hardware safety mechanism 242 detects a fault condition, the hardware safety mechanism 242 sets the digital voltage substrate register 244 to a binary "1" value. Otherwise, the hardware safety mechanism 242 sets the digital voltage substrate register 244 to a binary "0" value, indicating that no fault condition has been detected.

Figure 3:
FIG. 3 is a simplified schematic of an analog differential voltage substrate register having a binary diagnostic bit therein that is utilized in the battery cell voltage monitoring IC in the system of FIG. 1.

Referring to FIGS. 1 and 3, the analog differential voltage substrate 224 includes an analog-to-digital converter (ADC) 280, and first, second, third, and fourth voltage comparators 282, 284, 286, 288, a hardware safety mechanism 290, and an analog differential voltage substrate register 292.

The hardware safety mechanism 290 is utilized to detect a fault condition within the analog differential voltage substrate 224. When the hardware safety mechanism 290 detects a fault condition, the hardware safety mechanism 290 sets the analog differential voltage substrate register 292 to a binary "1" value. Otherwise, the hardware safety mechanism 290 sets the analog differential voltage substrate register 292 to a binary "0" value, indicating that no fault condition has been detected.

The ADC 280 includes ADC differential channels 310, 312, 314, 316 for measuring battery cell voltages of the first, second, third, fourth battery cells 91, 92, 93, 94, respectively.

The ADC differential channel 310 has input pins P1, P2 which are electrically coupled to the positive terminal 100 and the negative terminal 102, respectively, of the first battery cell 91 to measure an output voltage of the first battery cell 91 between the terminals 100, 102, and the analog-to-digital converter 280 generates a battery cell voltage value based on the measured output voltage.

The ADC differential channel 312 has input pins P3, P4 which are electrically coupled to the positive terminal 110 and the negative terminal 112, respectively, of the second battery cell 92 to measure an output voltage of the second battery cell 92 between the terminals 110, 112, and the analog-to-digital converter 280 generates a battery cell voltage value based on the measured output voltage.

The ADC differential channel 314 has input pins P5, P6 which are electrically coupled to the positive terminal 120 and the negative terminal 122, respectively, of the third battery cell 93 to measure an output voltage of the third battery cell 93 between the terminals 120, 122, and the analog-to-digital converter 280 generates a battery cell voltage value based on the measured output voltage.

The ADC differential channel 316 has input pins P7, P8 which are electrically coupled to the positive terminal 130 and the negative terminal 132, respectively, of the fourth battery cell 94 to measure an output voltage of the fourth battery cell 94 between the terminals 130, 132, and the analog-to-digital converter 280 generates a battery cell voltage value based on the measured output voltage.

The first voltage comparator 282 is electrically coupled to the input pins P1, P2 of the ADC differential channel 310, and compares the output voltage (between input pins P1, P2) of the first battery cell 91 to a voltage comparator threshold voltage. If the output voltage of the first battery cell 91 is greater than the voltage comparator threshold voltage indicating a cell overvoltage condition, the first voltage comparator 282 sets an associated overvoltage fault bit to a binary "1" value (i.e., a fault value). Otherwise, the first voltage comparator 282 sets the associated overvoltage fault bit to a binary "0" value (i.e., a non-fault value).

The second voltage comparator 284 is electrically coupled to the input pins P3, P4 of the ADC differential channel 312, and compares the output voltage (between input pins P3, P4) of the second battery cell 92 to a voltage comparator threshold voltage. If the output voltage of the second battery cell 92 is greater than the voltage comparator threshold voltage indicating a cell overvoltage condition, the second voltage comparator 284 sets an associated overvoltage fault bit to a binary "1" value (i.e., a fault value). Otherwise, the second voltage comparator 284 sets the associated overvoltage fault bit to a binary "0" value.

The third voltage comparator 286 is electrically coupled to the input pins P5, P6 of the ADC differential channel 314, and compares the output voltage (between input pins P5, P6) of the third battery cell 93 to a voltage comparator threshold voltage. If the output voltage of the third battery cell 93 is greater than the voltage comparator threshold voltage indicating a cell overvoltage condition, the third voltage comparator 286 sets an associated overvoltage fault bit to a binary "1" value (i.e., a fault value). Otherwise, the third voltage comparator 286 sets the associated overvoltage fault bit to a binary "0" value.

The fourth voltage comparator 288 is electrically coupled to the input pins P7, P8 of the ADC differential channel 316, and compares the output voltage (between input pins P7, P8) of the fourth battery cell 94 to a voltage comparator threshold voltage. If the output voltage of the fourth battery cell 94 is greater than the voltage comparator threshold voltage indicating a cell overvoltage condition, the fourth voltage comparator 288 sets an associated overvoltage fault bit to a binary "1" value (i.e., a fault value). Otherwise, the fourth voltage comparator 288 sets the associated overvoltage fault bit to a binary "0" value.

Figure 4:
FIG. 4 is a simplified schematic of an analog voltage substrate register having a binary diagnostic bit therein that is utilized in the battery cell voltage monitoring IC in the system of FIG. 1.

Referring to FIGS. 1 and 4, the analog voltage substrate 226 includes a non-differential ADC 354, a hardware safety mechanism 350, and an analog voltage substrate register 352.

The hardware safety mechanism 350 is utilized to detect a fault condition within the analog voltage substrate 226. When the hardware safety mechanism 350 detects a fault condition, the hardware safety mechanism 350 sets the analog voltage substrate register 352 to a binary "1" value. Otherwise, the hardware safety mechanism 350 sets the analog voltage substrate register 352 to a binary "0" value, indicating that no fault condition has been detected.

The battery cell voltage monitoring IC 200 operably communicates with the microcontroller 210 via the communication bus 220. In particular, the battery cell voltage monitoring IC 200 sends battery cell voltage values and the binary diagnostic bits in the registers 244, 292, 352 to the microcontroller 210 via the communication bus 220.

The microcontroller 210 is provided to control operation of the contactor 40 and to monitor the battery cell voltage values and the binary diagnostic bits in the digital voltage substrate register 244, the analog differential voltage substrate register 292, and the analog voltage substrate register 352. The microcontroller 210 includes a microprocessor 380, a digital input-output device 382, a flash memory device 384, and first and second memory buffers 386, 388. The microprocessor 380 is operably coupled to the digital input-output device 382, the flash memory device 384, and the first and second memory buffers 386, 388. The digital input-output device 382 is electrically coupled to the voltage drivers 60, 62 via the electrical lines 74, 78, respectively.

Figures 11, 12, 13:
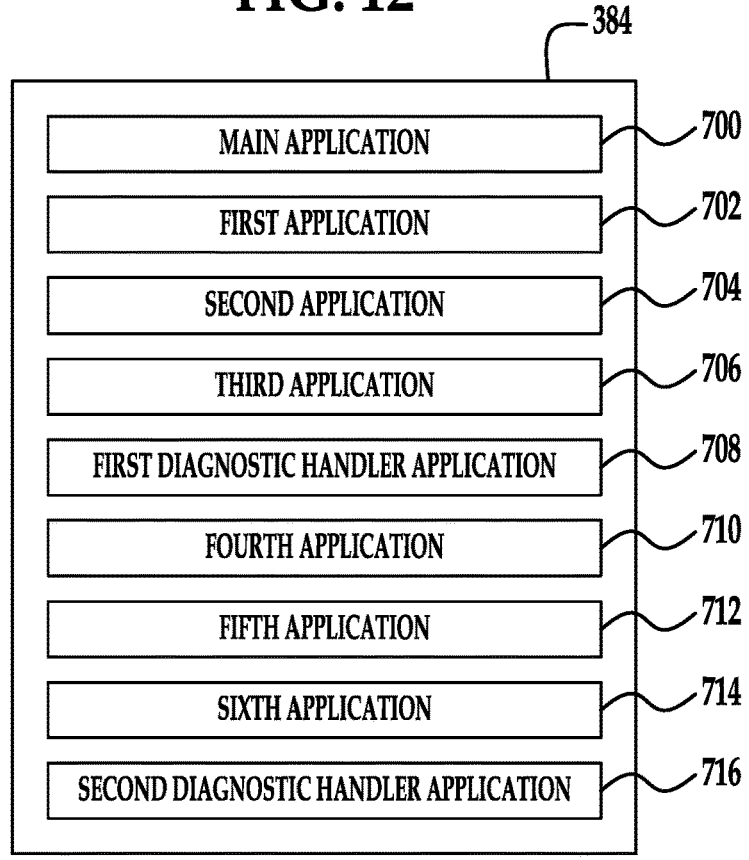
FIG. 11 is a table having a fault value and a non-fault value for a fifth diagnostic flag associated with an analog differential voltage substrate in the battery cell voltage monitoring IC.
FIG. 12 is a table having a fault value and a non-fault value for a sixth diagnostic flag associated with an analog voltage substrate in the battery cell voltage monitoring IC.
FIG. 13 is a block diagram of a main application, first, second, third, fourth, fifth, sixth applications, and first and second diagnostic handler applications utilized in the system of FIG. 1.

Referring to FIGS. 1 and 13, the flash memory device 384 includes a main application 700, a first application 702, a second application 704, a third application 706, a first diagnostic handler application 708, a fourth application 710, a fifth application 712, a sixth application 714, and a second diagnostic handler application 716 stored therein which is executed by the microprocessor 380. Further, referring to FIGS. 1 and 5-12, the memory device 384 stores tables 500, 510, 520, 530, 540, 550 therein.

Figure 5:
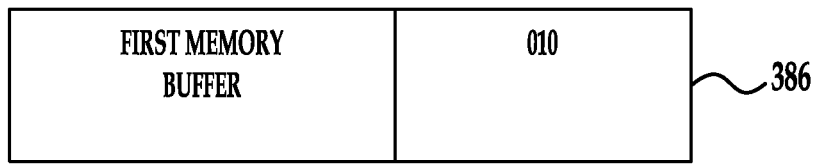
FIG. 5 is a simplified schematic of a first memory buffer having first, second, and third diagnostic bits corresponding to the binary bits in the digital voltage substrate register, the analog differential voltage substrate register, and the analog voltage substrate register, respectively, that are utilized in a microcontroller in the system of FIG. 1.

Referring to FIG. 5, exemplary contents of the first memory buffer 386 is illustrated. The microcontroller 210 copies the first, second, third bits from the digital voltage substrate register 244, the analog differential voltage substrate register 292, and the analog voltage substrate register 352, respectively, into the first memory buffer 386.

Figure 6:
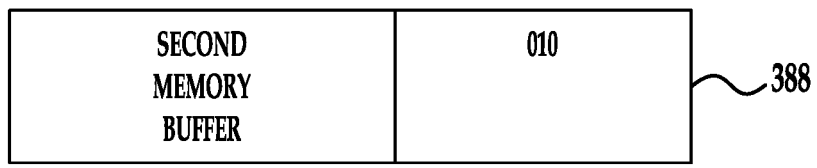
FIG. 6 is a simplified schematic of a second memory buffer having first, second, and third diagnostic bits corresponding to the binary bits in the digital voltage substrate register, the analog differential voltage substrate register, and the analog voltage substrate register, respectively, that are utilized in a microcontroller in the system of FIG. 1.

Referring to FIG. 6, exemplary contents of the second memory buffer 388 is illustrated. The microcontroller 210 copies the first, second, third bits from the digital voltage substrate register 244, the analog differential voltage substrate register 292, and the analog voltage substrate register 352, respectively, into the first memory buffer 386.

Referring to FIGS. 7 and 13, a table 500 having an encoded fault value (e.g., 21 hexadecimal), and an encoded non-fault value (e.g., 12 hexadecimal) for a first diagnostic flag associated with the digital voltage substrate 222 and utilized by the first application 702 is illustrated.

Referring to FIGS. 8 and 13, a table 510 having an encoded fault value (e.g., 48 hexadecimal), and an encoded non-fault value (e.g., 84 hexadecimal) for a second diagnostic flag associated with the analog differential voltage substrate 224 and utilized by the second application 704 is illustrated.

Referring to FIGS. 9 and 13, a table 520 having an encoded fault value (e.g., B7 hexadecimal), and an encoded non-fault value (e.g., 7B hexadecimal) for a third diagnostic flag associated with the analog voltage substrate 226 and utilized by the third application 706 is illustrated.

Referring to FIGS. 10 and 13, a table 530 having an encoded fault value (e.g., 84 hexadecimal), and an encoded non-fault value (e.g., 48 hexadecimal) for a fourth diagnostic flag associated with the digital voltage substrate 222 and utilized by the fourth application 710 is illustrated.

Referring to FIGS. 11 and 13, a table 540 having an encoded fault value (e.g., 7B hexadecimal), and an encoded non-fault value (e.g., B7 hexadecimal) for a fifth diagnostic flag associated with the analog differential voltage substrate 224 and utilized by the fifth application 712 is illustrated.

Figure 14:
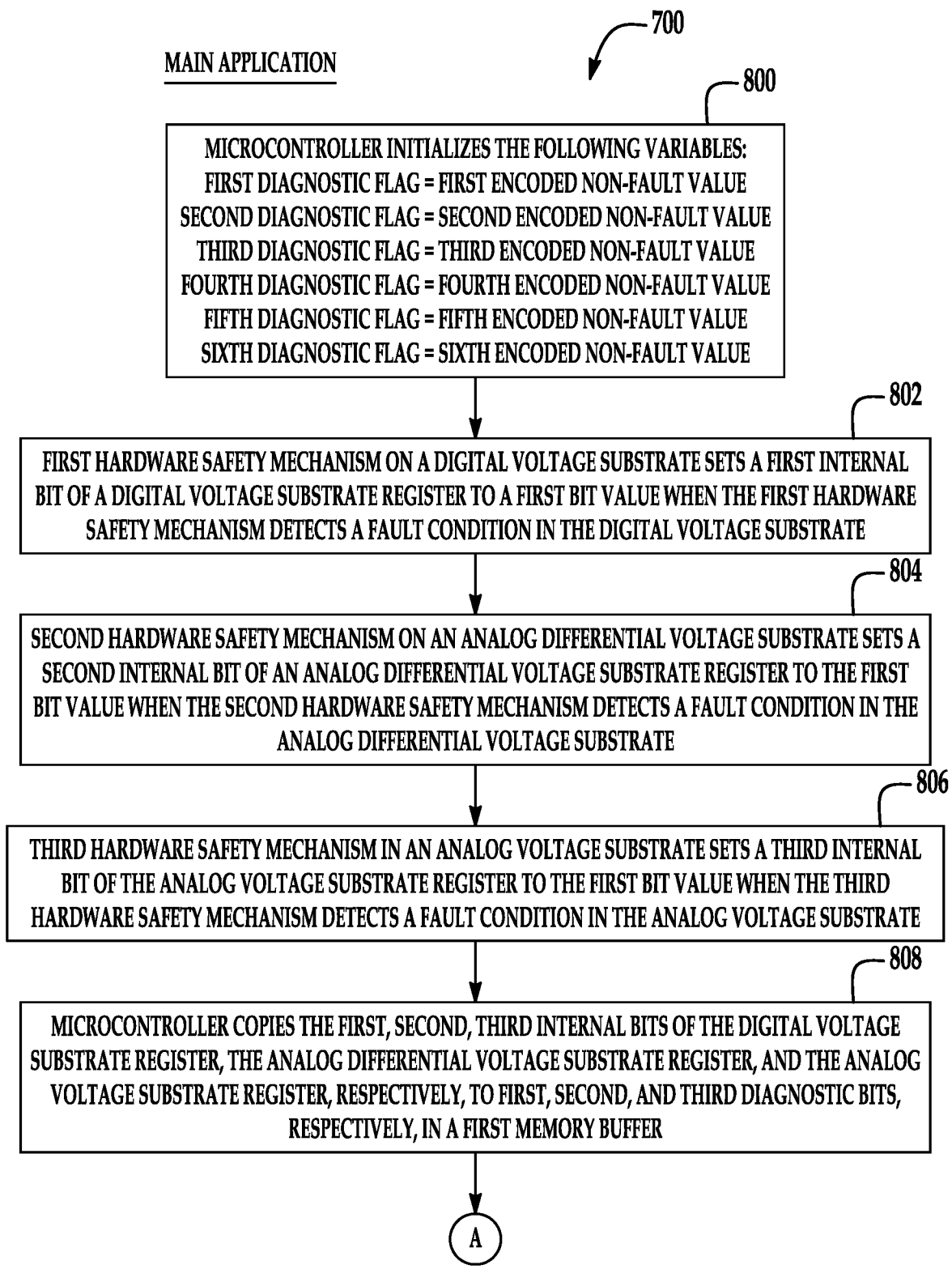
FIGS. 14-23 are flowcharts of a diagnostic method for the system of FIG. 1 utilizing the main application, the first, second, third, fourth, fifth, sixth applications, and the first and second diagnostic handler applications.

Referring to FIGS. 11 and 14, a table 550 having an encoded fault value (e.g., 12 hexadecimal), and an encoded non-fault value (e.g., 21 hexadecimal) for a sixth diagnostic flag associated with the analog voltage substrate 226 and utilized by the sixth application 714 is illustrated.

Referring to FIGS. 7 and 10, the encoded fault value in the table 500 for the first diagnostic flag has a Hamming distance of four from the encoded fault value in the diagnostic table 530 for the fourth diagnostic flag. Further, the encoded non-fault value in the table 500 for the first diagnostic flag has a Hamming distance of four from the encoded non-fault value in the diagnostic table 530 for the fourth diagnostic flag.

Referring to FIGS. 8 and 11, the encoded fault value in the table 510 for the second diagnostic flag has a Hamming distance of four from the encoded fault value in the diagnostic table 540 for the fifth diagnostic flag. Further, the encoded non-fault value in the table 510 for the second diagnostic flag has a Hamming distance of four from the encoded non-fault value in the diagnostic table 540 for the fifth diagnostic flag.

Referring to FIGS. 9 and 12, the encoded fault value in the table 520 for the third diagnostic flag has a Hamming distance of four from the encoded fault value in the diagnostic table 550 for the sixth diagnostic flag. Further, the encoded non-fault value in the table 520 for the third diagnostic flag has a Hamming distance of four from the encoded non-fault value in the diagnostic table 550 for the sixth diagnostic flag.

Referring to FIGS. 1 and 14-23, a flowchart of a diagnostic method for the self-diagnosing battery cell monitoring system 90 utilizing the main application 700, the first, second, third, fourth, fifth, sixth applications 702, 704, 706, 710, 712, 714, and the first and second diagnostic handler applications 708, 716 will be explained.

Figure 15:
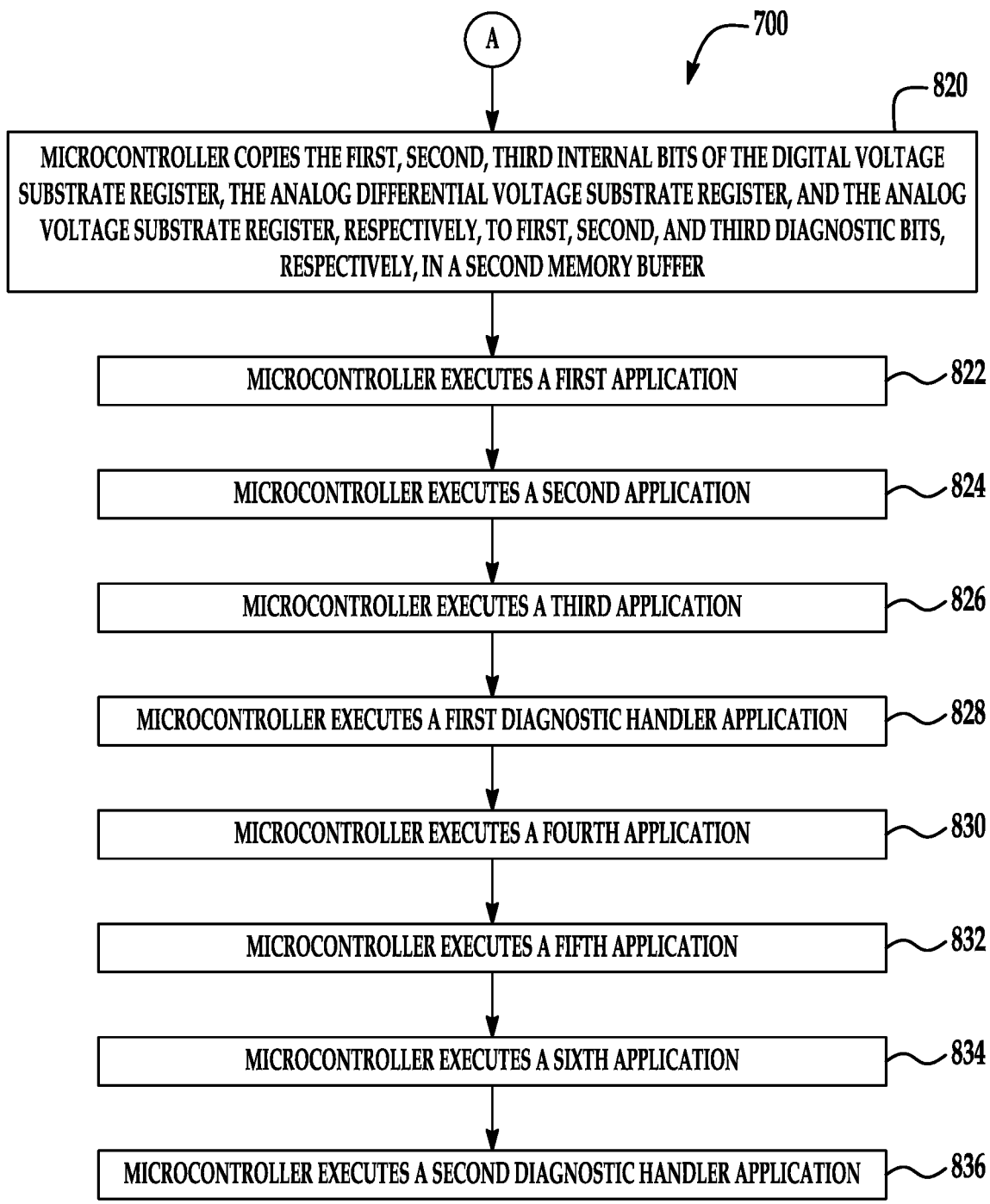

Referring to FIGS. 1, 14 and 15, the main application 700 will now be explained. It is noted that some steps (e.g., steps 802, 804, 806) that are included in the main application 700, for purposes of simplification, are performed by the battery cell voltage monitoring IC 200 which is external to the microcontroller 210.

At step 800, the microcontroller 210 initializes the following variables:
first diagnostic flag=first encoded non-fault value (e.g., 12 hexadecimal from table 500 in FIG. 7);
second diagnostic flag=second encoded non-fault value (e.g., 84 hexadecimal from table 510 in FIG. 8);
third diagnostic flag=third encoded non-fault value (e.g., 7A hexadecimal from table 520 in FIG. 9);
fourth diagnostic flag=fourth encoded non-fault value (e.g., 48 hexadecimal from table 530 in FIG. 10);
fifth diagnostic flag=fifth encoded non-fault value (e.g., A7 hexadecimal from table 540 in FIG. 11);
sixth diagnostic flag=sixth encoded non-fault value (e.g., 21 hexadecimal from table 550 in FIG. 12).

At step 802, the hardware safety mechanism 242 on a digital voltage substrate 222 sets a first internal bit of a digital voltage substrate register 244 to a first bit value when the hardware safety mechanism 242 detects a fault condition in the digital voltage substrate 222.

At step 804, the hardware safety mechanism 290 on an analog differential voltage substrate 224 sets a second internal bit of an analog differential voltage substrate register 292 to the first bit value when the hardware safety mechanism 290 detects a fault condition in the analog differential voltage substrate 224.

At step 806, the hardware safety mechanism 350 in an analog voltage substrate 226 sets a third internal bit of the analog voltage substrate register 352 to the first bit value when the hardware safety mechanism 350 detects a fault condition in the analog voltage substrate 226.

At step 808, the microcontroller 210 copies the first, second, third internal bits of the digital voltage substrate register 244, the analog differential voltage substrate register 292, and the analog voltage substrate register 352, respectively, to first, second, and third diagnostic bits, respectively, in a first memory buffer 386.

At step 820, the microcontroller 210 copies the first, second, third internal bits of the digital voltage substrate register 244, the analog differential voltage substrate register 292, and the analog voltage substrate register 352, respectively, to first, second, and third diagnostic bits, respectively, in a second memory buffer 388.

At step 822, the microcontroller 210 executes a first application 702.

At step 824, the microcontroller 210 executes a second application 704.

At step 826, the microcontroller 210 executes a third application 706.

At step 828, the microcontroller 210 executes a first diagnostic handler application 708.

At step 830, the microcontroller 210 executes a fourth application 710.

At step 832, the microcontroller 210 executes a fifth application 712.

At step 834, the microcontroller 210 executes a sixth application 714.

At step 836, the microcontroller 210 executes a second diagnostic handler application 716.

Figure 16:
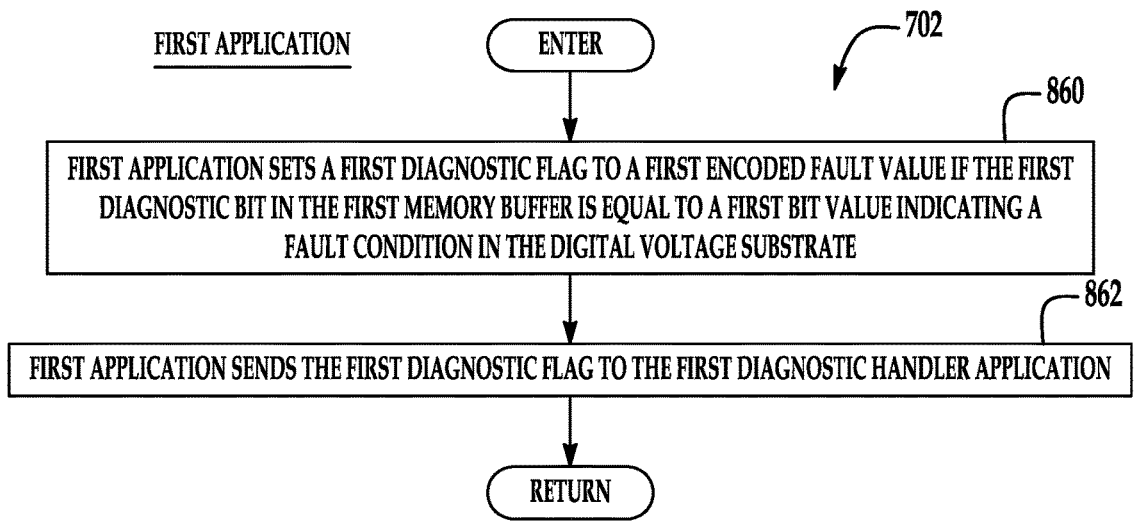

Referring to FIGS. 1 and 16, the first application 702 will now be explained.

At step 860, the first application 702 sets a first diagnostic flag to a first encoded fault value (e.g., 21 hexadecimal from table 500 in FIG. 7) if the first diagnostic bit in the first memory buffer 386 is equal to a first bit value (e.g., binary 1) indicating a fault condition in the digital voltage substrate 222.

At step 862, the first application 702 sends the first diagnostic flag to the first diagnostic handler application 708. After step 862, the method returns to the main application 700.

Figure 17:
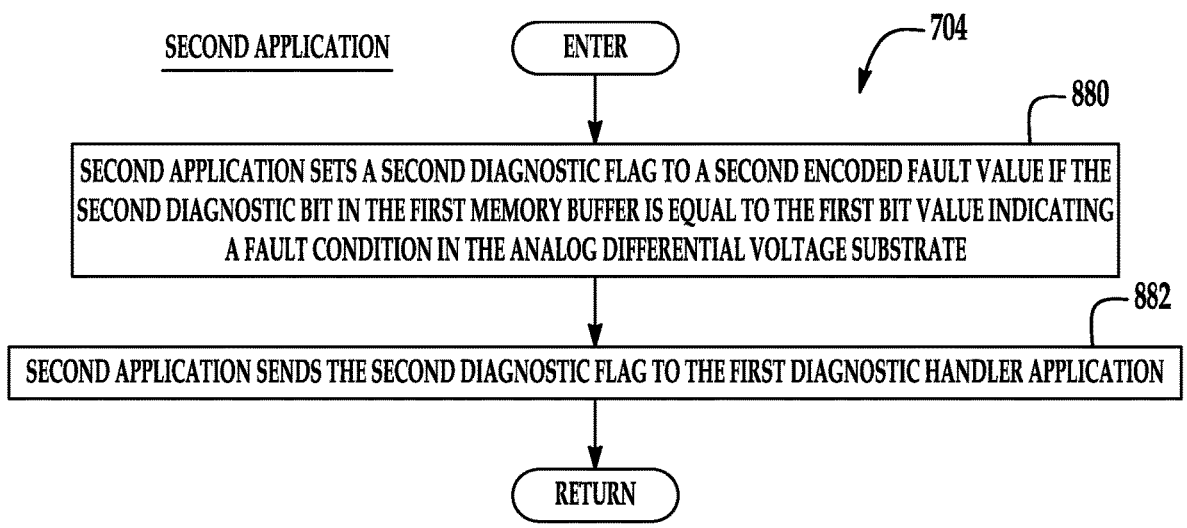

Referring to FIGS. 1 and 17, the second application 704 will now be explained.

At step 880, the second application 704 sets a second diagnostic flag to a second encoded fault value (e.g., 48 hexadecimal from table 510 in FIG. 8) if the second diagnostic bit in the first memory buffer 386 is equal to the first bit value indicating a fault condition in the analog differential voltage substrate 224.

At step 882, the second application 704 sends the second diagnostic flag to the first diagnostic handler application 708. After step 882, the method returns to the main application 700.

Figure 18:
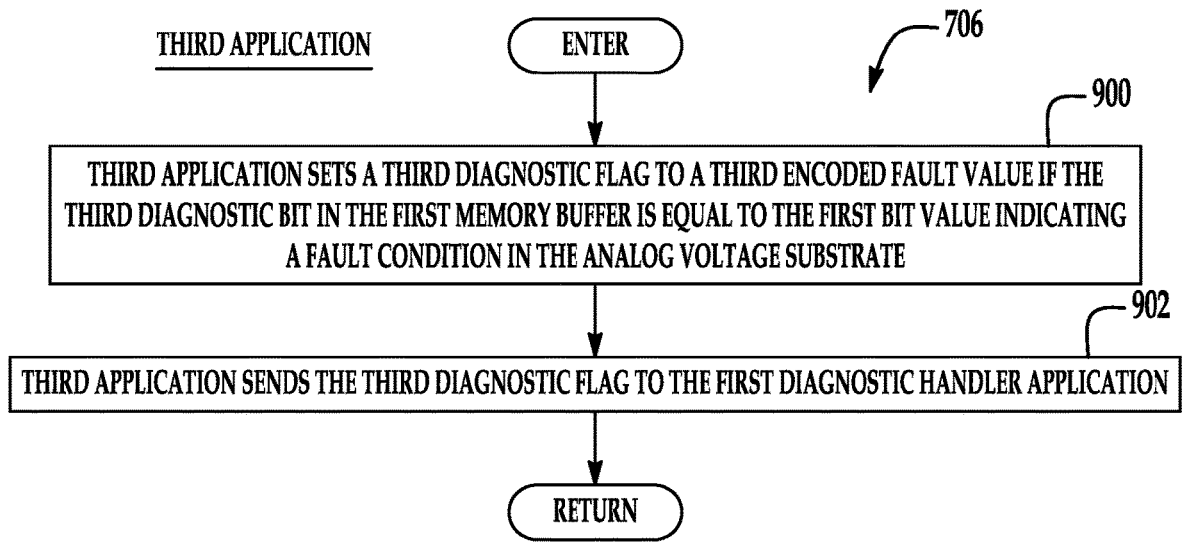

Referring to FIGS. 1 and 18, the third application 706 will now be explained.

At step 900, the third application 706 sets a third diagnostic flag to a third encoded fault value (e.g., A7 hexadecimal from table 520 in FIG. 9) if the third diagnostic bit in the first memory buffer 386 is equal to the first bit value indicating a fault condition in the analog voltage substrate 226.

At step 902, the third application 706 sends the third diagnostic flag to the first diagnostic handler application 708. After step 902, the method returns to the main application 700.

Figure 19:
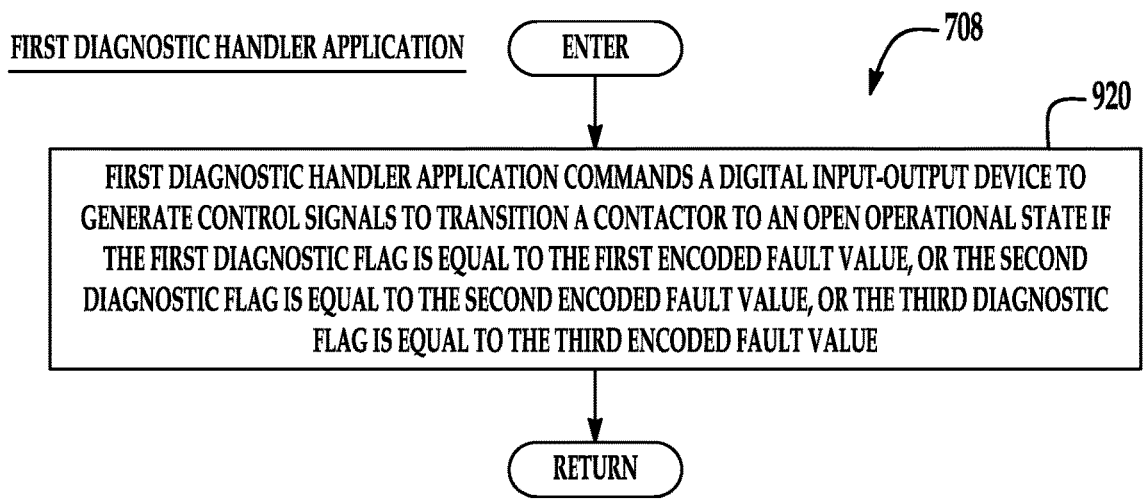

Referring to FIGS. 1 and 19, the first diagnostic handler application 708 will now be explained.

At step 920, the first diagnostic handler application 708 commands a digital input-output device 382 to generate control signals to transition a contactor 40 to an open operational state if the first diagnostic flag is equal to the first encoded fault value, or the second diagnostic flag is equal to the second encoded fault value, or the third diagnostic flag is equal to the third encoded fault value. After step 920, the method returns to the main application 700.

Figure 20:
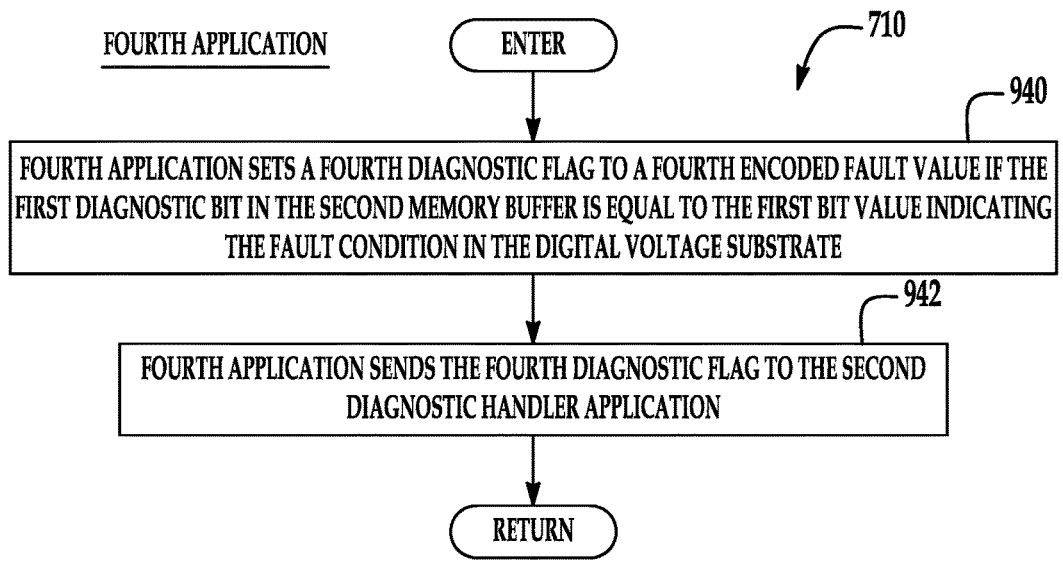

Referring to FIGS. 1 and 20, the fourth application 710 will now be explained.

At step 940, the fourth application 710 sets a fourth diagnostic flag to a fourth encoded fault value (e.g., 84 hexadecimal from table 530 in FIG. 10) if the first diagnostic bit in the second memory buffer 388 is equal to the first bit value indicating the fault condition in the digital voltage substrate 222.

At step 942, the fourth application 710 sends the fourth diagnostic flag to the second diagnostic handler application 716. After step 942, the method returns to the main application 700.

Figure 21:
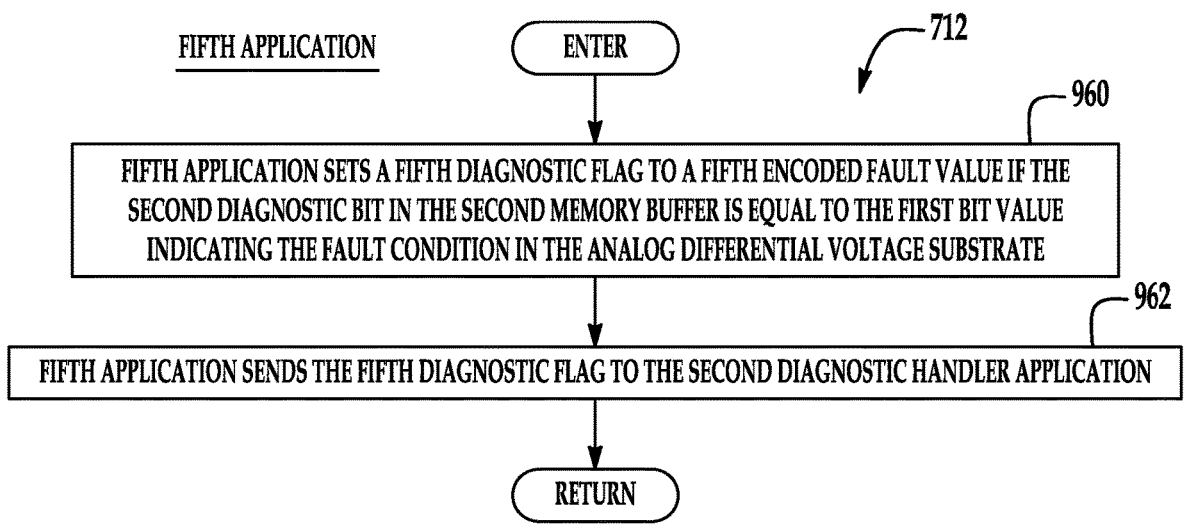

Referring to FIGS. 1 and 21, the fifth application 712 will now be explained.

At step 960, the fifth application 712 sets a fifth diagnostic flag to a fifth encoded fault value (e.g., 7A hexadecimal from table 540 in FIG. 11) if the second diagnostic bit in the second memory buffer 388 is equal to the first bit value indicating the fault condition in the analog differential voltage substrate 224.

At step 962, the fifth application 712 sends the fifth diagnostic flag to the second diagnostic handler application 716. After step 962, the method returns to the main application 700.

Figure 22:
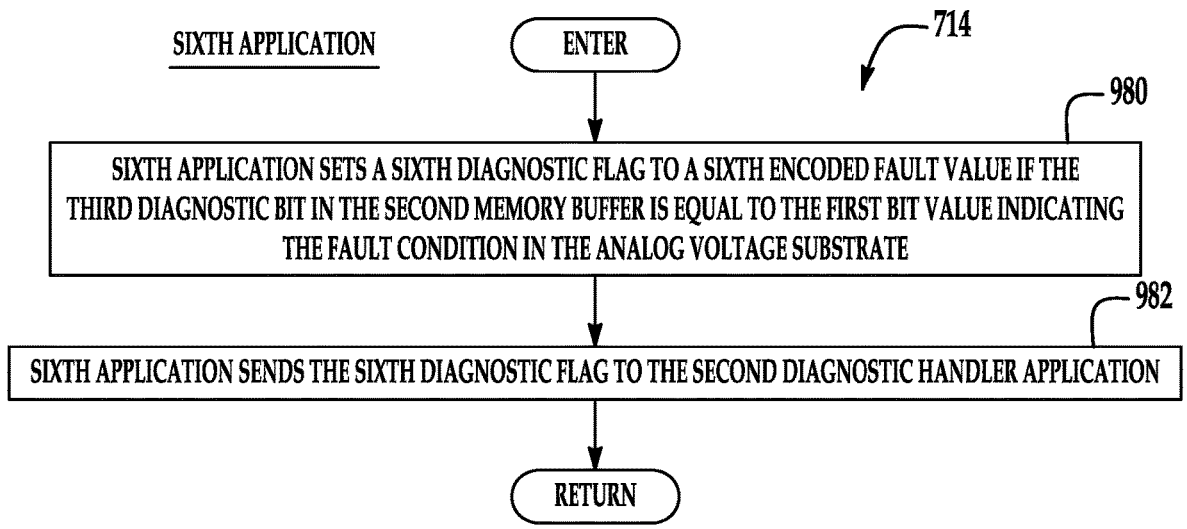

Referring to FIGS. 1 and 22, the sixth application 714 will now be explained.

At step 980, the sixth application 714 sets a sixth diagnostic flag to a sixth encoded fault value (e.g., 12 hexadecimal from table 550 in FIG. 12) if the third diagnostic bit in the second memory buffer 388 is equal to the first bit value indicating the fault condition in the analog voltage substrate 226.

At step 982, the sixth application 714 sends the sixth diagnostic flag to the second diagnostic handler application 716. After step 982, the method returns to the main application 700.

Figure 23:
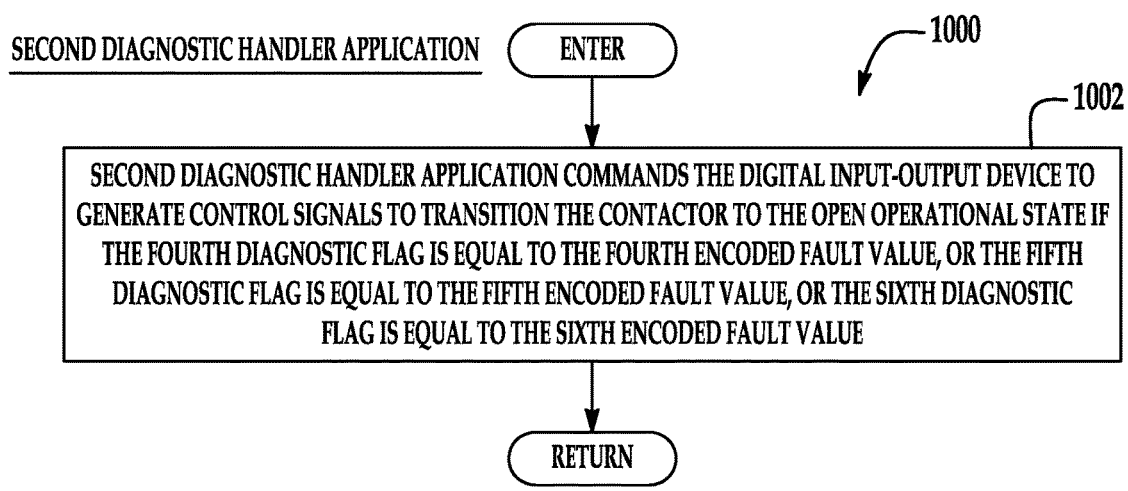

Referring to FIGS. 1 and 23, the second diagnostic handler application 1000 will now be explained.

At step 1002, the second diagnostic handler application 716 commands the digital input-output device 382 to generate control signals to transition the contactor 40 to the open operational state if the fourth diagnostic flag is equal to the fourth encoded fault value, or the fifth diagnostic flag is equal to the fifth encoded fault value, or the sixth diagnostic flag is equal to the sixth encoded fault value. After step 1002, the method returns to the main application 700.

The self-diagnosing battery cell monitoring system described herein provides a substantial advantage over other systems. In particular, the self-diagnosing battery cell monitoring system can detect fault conditions in a battery cell voltage monitoring IC and utilizes diagnostic flags associated with a digital voltage substrate, an analog differential voltage substrate, an analog voltage substrate in the battery cell voltage monitoring IC having encoded fault values or encoded non-fault values with Hamming distances of four from one another to obtain freedom from interference with the diagnostic flags.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A self-diagnosing battery cell monitoring system, comprising:
    a battery cell voltage monitoring IC having a digital voltage substrate, an analog differential voltage substrate, and an analog voltage substrate therein having trenched electrical isolation therebetween;
    a microcontroller having a first memory buffer, first, second, and third applications, and a first diagnostic handler application;
    the first memory buffer having first, second, and third diagnostic bits associated with the digital voltage substrate, the analog differential voltage substrate, and the analog voltage substrate, respectively;
    the first application setting a first diagnostic flag to a first encoded fault value if the first diagnostic bit in the first memory buffer is equal to a first bit value indicating a fault condition in the digital voltage substrate;
    the second application setting a second diagnostic flag to a second encoded fault value if the second diagnostic bit in the first memory buffer is equal to the first bit value indicating a fault condition in the analog differential voltage substrate;
    the third application setting a third diagnostic flag to a third encoded fault value if the third diagnostic bit in the first memory buffer is equal to the first bit value indicating a fault condition in the analog voltage substrate; and
    the first diagnostic handler application commanding a digital input-output device to generate control signals to transition a contactor to an open operational state if the first diagnostic flag is equal to the first encoded fault value, or the second diagnostic flag is equal to the second encoded fault value, or the third diagnostic flag is equal to the third encoded fault value.

2. The self-diagnosing battery cell monitoring system of claim 1, wherein:
    the microcontroller further includes a second memory buffer, fourth, fifth, and sixth applications, and a second diagnostic handler application;
    the second memory buffer having first, second, and third diagnostic bits associated with the digital voltage substrate, the analog differential voltage substrate, and the analog voltage substrate, respectively;
    the fourth application setting a fourth diagnostic flag to a fourth encoded fault value if the first diagnostic bit in the second memory buffer is equal to the first bit value indicating the fault condition in the digital voltage substrate;

the fifth application setting a fifth diagnostic flag to a fifth encoded fault value if the second diagnostic bit in the second memory buffer is equal to the first bit value indicating the fault condition in the analog differential voltage substrate;

the sixth application setting a sixth diagnostic flag to a sixth encoded fault value if the third diagnostic bit in the second memory buffer is equal to the first bit value indicating the fault condition in the analog voltage substrate; and the second diagnostic handler application commanding the digital input-output device to generate control signals to transition the contactor to the open operational state if the fourth diagnostic flag is equal to the fourth encoded fault value, or the fifth diagnostic flag is equal to the fifth encoded fault value, or the sixth diagnostic flag is equal to the sixth encoded fault value.

3. The self-diagnosing battery cell monitoring system of claim 1, wherein:

the digital voltage substrate having a digital substrate register thereon having a first internal bit that is equal to the first bit value when the fault condition occurs in the digital voltage substrate;

the analog differential voltage substrate having an analog differential voltage substrate register thereon with a second internal bit that is equal to the first bit value when the fault condition occurs in the analog differential voltage substrate;

the analog voltage substrate having an analog voltage substrate register thereon with a third internal bit that is equal to the first bit value when the fault condition occurs in the analog voltage substrate;

the microcontroller copying the first, second, and third internal bits to the first, second, and third bits of the first memory buffer; and the microcontroller copying the first, second, and third internal bits to the first, second, and third bits of the second memory buffer.

4. The self-diagnosing battery cell monitoring system of claim 3, wherein the digital voltage substrate further includes a hardware safety mechanism that sets the first internal bit of the digital voltage substrate register to the first bit value when the hardware safety mechanism detects the fault condition in the digital voltage substrate.

5. The self-diagnosing battery cell monitoring system of claim 3, wherein the digital voltage substrate further includes a communication channel device thereon.

6. The self-diagnosing battery cell monitoring system of claim 3, wherein the analog differential voltage substrate further includes a hardware safety mechanism that sets the second internal bit of the analog differential voltage substrate register to the first bit value when the hardware safety mechanism detects the fault condition in the analog differential voltage substrate.

7. The self-diagnosing battery cell monitoring system of claim 3, wherein the analog differential voltage substrate further includes an analog-to-digital converter with differential channels therein, and a voltage comparator.

8. The self-diagnosing battery cell monitoring system of claim 3, wherein the analog voltage substrate further includes a hardware safety mechanism that sets the third internal bit of the analog voltage substrate register to the first bit value when the hardware safety mechanism detects the fault condition in the analog voltage substrate.

9. The self-diagnosing battery cell monitoring system of claim 3, wherein the analog voltage substrate further includes an analog-to-digital converter with non-differential channels therein.

10. The self-diagnosing battery cell monitoring system of claim 3, wherein the first encoded fault value and the fourth encoded fault value have a Hamming distance of four from one another.

11. The self-diagnosing battery cell monitoring system of claim 3, wherein the second encoded fault value and the fifth encoded fault value have a Hamming distance of four from one another.

12. The self-diagnosing battery cell monitoring system of claim 3, wherein the third encoded fault value and the sixth encoded fault value have a Hamming distance of four from one another.

13. The self-diagnosing battery cell monitoring system of claim 3, wherein the first, second, and third encoded fault values each have a Hamming distance of four from one another.

14. The self-diagnosing battery cell monitoring system of claim 3, wherein the fourth, fifth, and sixth encoded fault values each have a Hamming distance of four from one another.

* * * * *